United States Patent
Kim

(10) Patent No.: US 10,679,971 B2
(45) Date of Patent: Jun. 9, 2020

(54) SEMICONDUCTOR PACKAGE

(71) Applicant: SK hynix Inc., Icheon-si, Gyeonggi-do (KR)

(72) Inventor: Yeon Ok Kim, Icheon-si (KR)

(73) Assignee: SK hynix Inc., Icheon-si, Gyeonggi-Do (KR)

( * ) Notice: Subject to any disclaimer, the term of this patent is extended or adjusted under 35 U.S.C. 154(b) by 9 days.

(21) Appl. No.: 16/116,734

(22) Filed: Aug. 29, 2018

(65) Prior Publication Data

US 2018/0374826 A1    Dec. 27, 2018

Related U.S. Application Data

(63) Continuation of application No. 15/462,039, filed on Mar. 17, 2017, now Pat. No. 10,199,357, which is a
(Continued)

(30) Foreign Application Priority Data

Mar. 24, 2014 (KR) .......................... 10-2014-0034034

(51) Int. Cl.
*H01L 23/48* (2006.01)
*H01L 25/065* (2006.01)
(Continued)

(52) U.S. Cl.
CPC ...... *H01L 25/0657* (2013.01); *H01L 23/3107* (2013.01); *H01L 23/32* (2013.01); *H01L 23/522* (2013.01); *H01L 23/585* (2013.01); *H01L 25/0652* (2013.01); *H01L 23/5256* (2013.01); *H01L 24/16* (2013.01); *H01L 27/0688* (2013.01); *H01L 2224/16145* (2013.01); *H01L 2224/16225* (2013.01); *H01L 2224/16227* (2013.01); *H01L 2224/17181* (2013.01);
(Continued)

(58) Field of Classification Search
CPC ............... H01L 25/0657; H01L 23/585; H01L 23/3107; H01L 2225/06568; H01L 2225/06541; H01L 23/3114; H01L 2225/06582; H01L 2224/04105; H01L 2224/12105; H01L 2224/28105; H01L 24/01; H01L 2224/01; H01L 29/0623
See application file for complete search history.

(56) References Cited

U.S. PATENT DOCUMENTS

2007/0181991 A1* 8/2007 Ishino .................... H01L 24/73
257/686
2008/0191205 A1    8/2008 Tsai et al.
(Continued)

FOREIGN PATENT DOCUMENTS

CN    101593738 A    12/2009
CN    101635162 A    1/2010
(Continued)

*Primary Examiner* — Cuong B Nguyen
*Assistant Examiner* — Samuel Park
(74) *Attorney, Agent, or Firm* — William Park & Associates Ltd.

(57) ABSTRACT

A semiconductor package may include: a plurality of slave chips stacked over a master chip through a through silicon via (TSV); a first guard unit disposed around each of the slave chips; and a second guard unit formed at a first distance from the first guard unit and disposed at the master chip.

6 Claims, 5 Drawing Sheets

Related U.S. Application Data continuation-in-part of application No. 14/284,886, filed on May 22, 2014, now abandoned.

(51) Int. Cl.

| | | |
|---|---|---|
| *H01L 23/58* | (2006.01) | |
| *H01L 23/31* | (2006.01) | |
| *H01L 23/32* | (2006.01) | |
| *H01L 23/522* | (2006.01) | |
| *H01L 23/525* | (2006.01) | |
| *H01L 23/00* | (2006.01) | |
| *H01L 27/06* | (2006.01) | |

(52) U.S. Cl.
CPC ............ *H01L 2225/06513* (2013.01); *H01L 2225/06517* (2013.01); *H01L 2225/06541* (2013.01); *H01L 2225/06555* (2013.01); *H01L 2225/06568* (2013.01); *H01L 2225/06582* (2013.01); *H01L 2225/06596* (2013.01); *H01L 2924/00012* (2013.01); *H01L 2924/00014* (2013.01); *H01L 2924/15311* (2013.01); *H01L 2924/181* (2013.01); *H01L 2924/18161* (2013.01)

(56) References Cited

U.S. PATENT DOCUMENTS

| | | | |
|---|---|---|---|
| 2008/0290492 A1 | 11/2008 | Chung et al. | |
| 2009/0267171 A1* | 10/2009 | Yean | ............ H01L 23/13 |
| | | | 257/434 |
| 2009/0294912 A1 | 12/2009 | Chibahara et al. | |
| 2011/0132652 A1 | 6/2011 | Ding et al. | |
| 2011/0309475 A1 | 12/2011 | Lee | |
| 2012/0003809 A1 | 1/2012 | Kim | |
| 2013/0087891 A1 | 4/2013 | Kang et al. | |
| 2013/0091315 A1 | 4/2013 | Ken et al. | |
| 2014/0084445 A1* | 3/2014 | Lin | ............ H01L 23/3677 |
| | | | 257/698 |
| 2015/0008417 A1 | 1/2015 | Ochi et al. | |
| 2015/0097271 A1 | 4/2015 | Ayotte et al. | |

FOREIGN PATENT DOCUMENTS

| | | |
|---|---|---|
| CN | 103117270 A | 5/2013 |
| KR | 1020050024669 A | 3/2005 |
| KR | 1020050097142 A | 10/2005 |

\* cited by examiner

US 10,679,971 B2

1

SEMICONDUCTOR PACKAGE

CROSS-REFERENCES TO RELATED APPLICATION

The present application is a continuation application for U.S. patent application Ser. No. 15/462,039, which is a continuation-in-part application for U.S. patent application Ser. No. 14/284,886 and claims priority under 35 U.S.C. § 119(a) to Korean application number 10-2014-0034034, filed on Mar. 24, 2014, in the Korean Intellectual Property Office, which is incorporated herein by reference in its entirety.

BACKGROUND

1. Technical Field

Various embodiments relate to a semiconductor package, and more particularly, to a semiconductor package having a through silicon via (TSV).

2. Related Art

Recently, with the requirement of high integration and high capacity of semiconductor products, a structure having a plurality of semiconductor chips stacked in a vertical direction has been proposed. Representative examples of the structure having a plurality of semiconductor chips stacked in a vertical direction may include a structure having a plurality of semiconductor chips stacked through TSVs.

The plurality of semiconductor chips stacked through TSVs may be packaged for commercialization. The semiconductor package refers to a structure which is sealed with mold resin or ceramic such that the semiconductor chips having micro circuits formed therein are protected from outside and mounted in an electronic device.

SUMMARY

In an embodiment, a semiconductor package may include a plurality of slave chips stacked over a master chip through a through silicon via (TSV). The semiconductor package may also include a first guard unit disposed around each of the slave chips. Further, the semiconductor package may include a second guard unit formed at a first distance from the first guard unit and disposed at the master chip.

In an embodiment, a semiconductor package may include a semiconductor chip stacked at one side of a top surface of an interposer. The semiconductor package may also include a control chip stacked at an other side of the top surface of the interposer. Further, the semiconductor chip may include a plurality of guard units.

In an embodiment, a semiconductor package may include a first guard unit configured to be disposed outside of a plurality of slave chips. The semiconductor package may also include a second guard unit configured to be disposed outside of a master chip. Moreover, the second guard unit is disposed at a distance from the first guard unit and configured at a height to allow the plurality of slave chips to be stacked.

2

Figure 2:
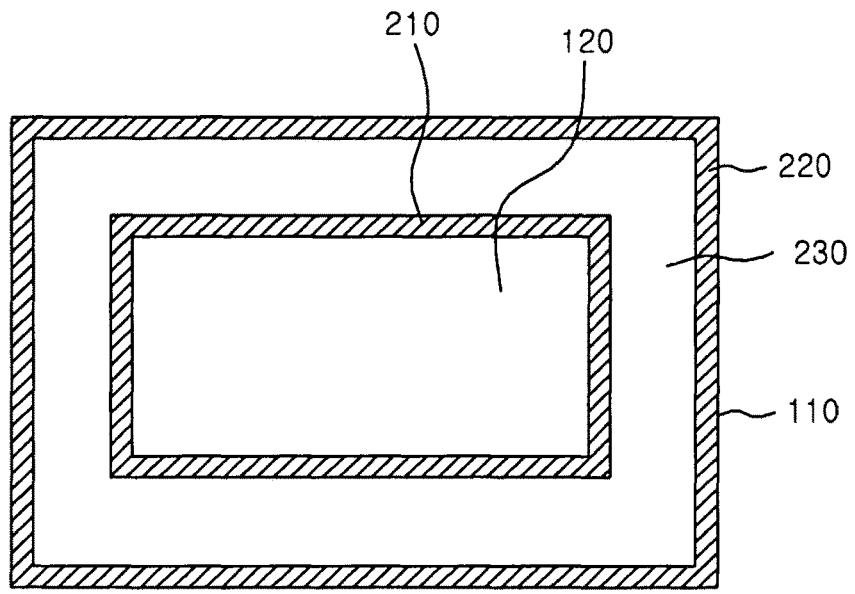
Figure 3:
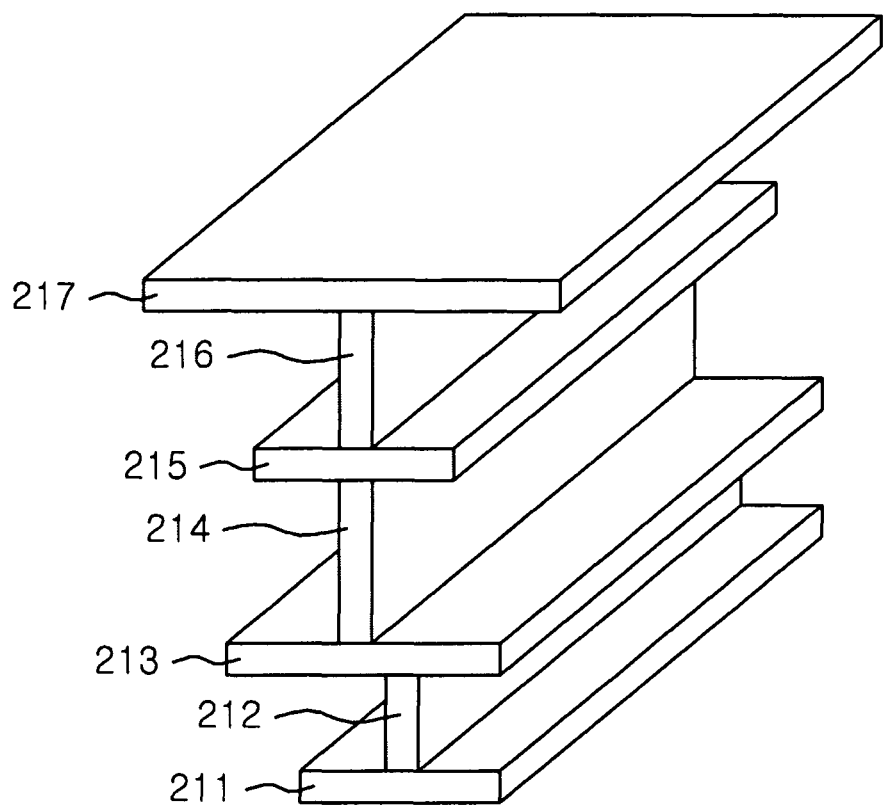
Figure 4A:
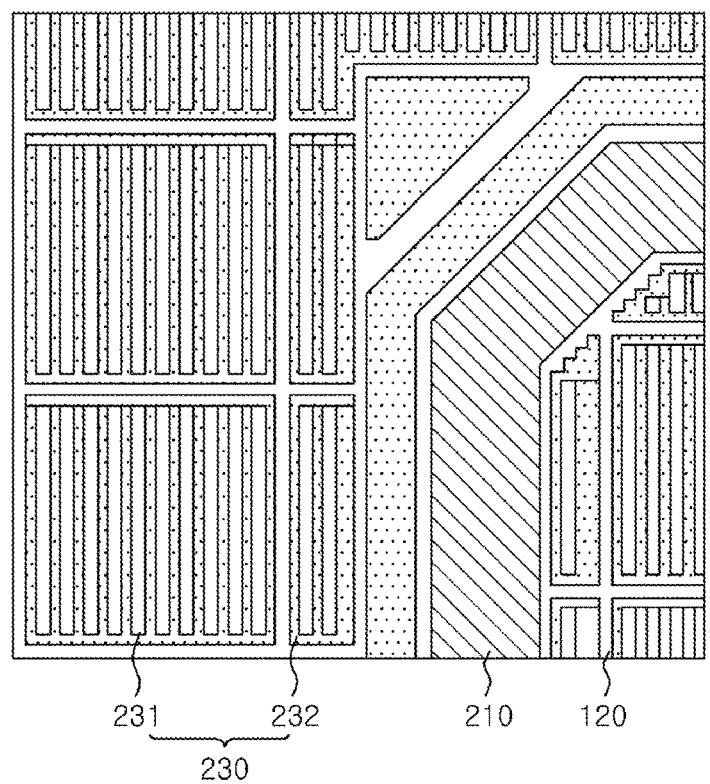
Figure 4B:
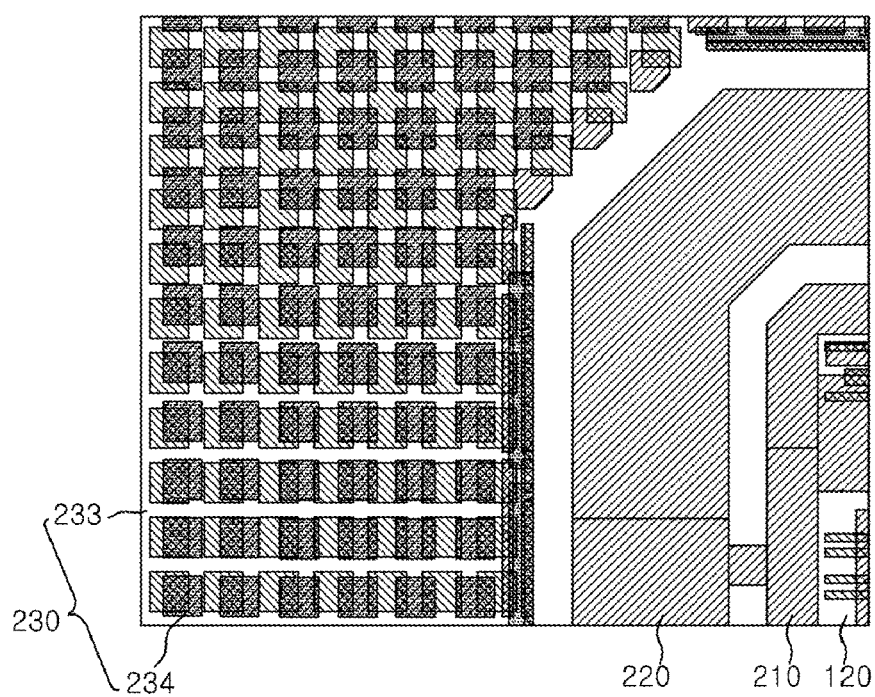
Figure 5:
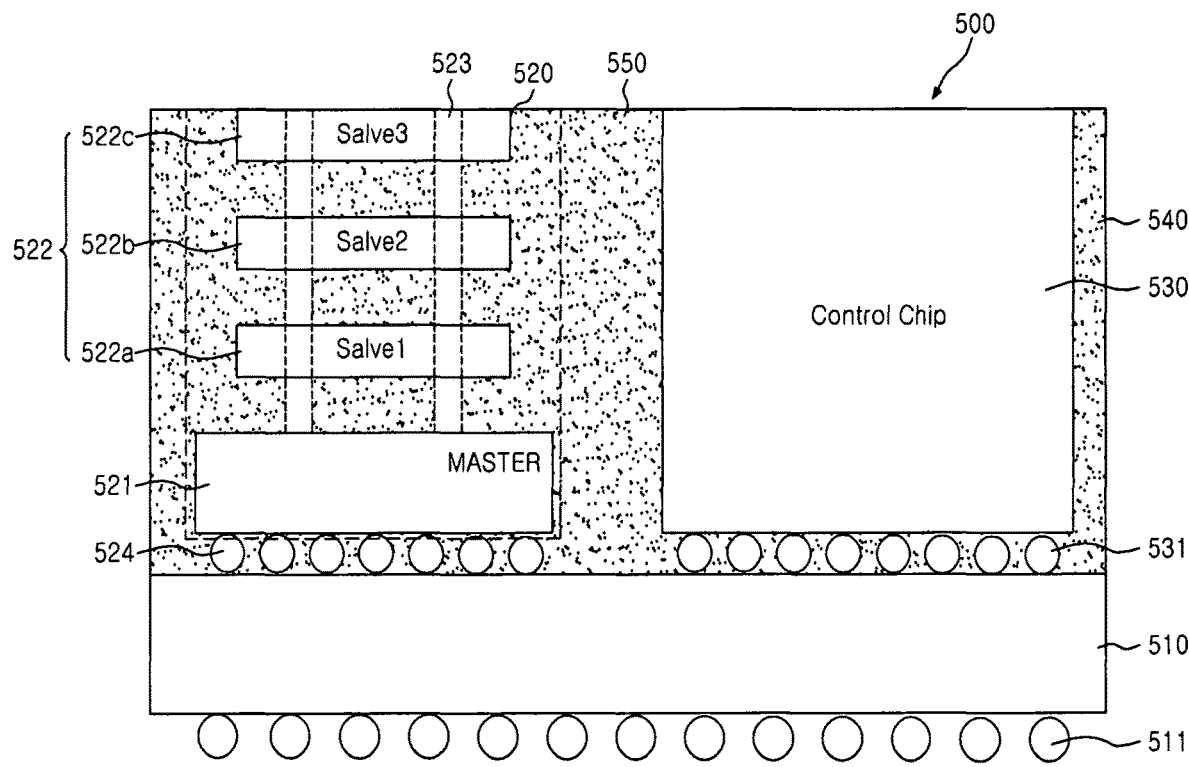
Figure 6:
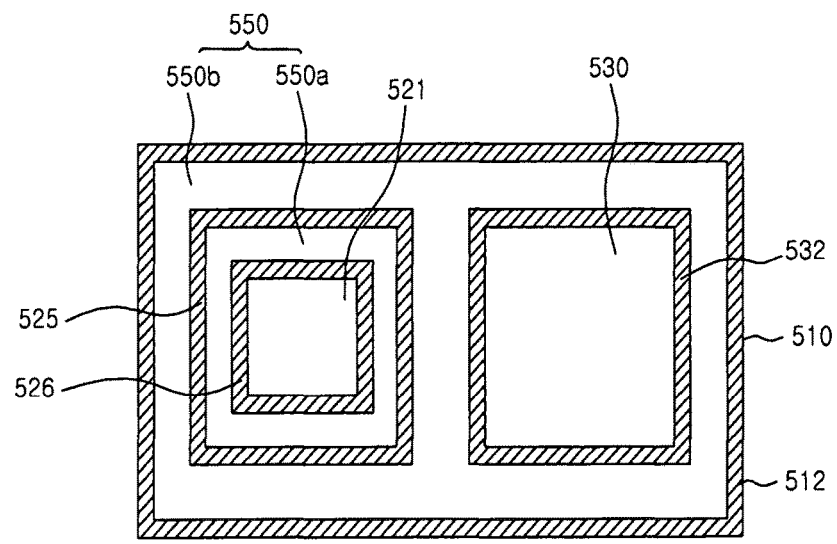
Figure 7:
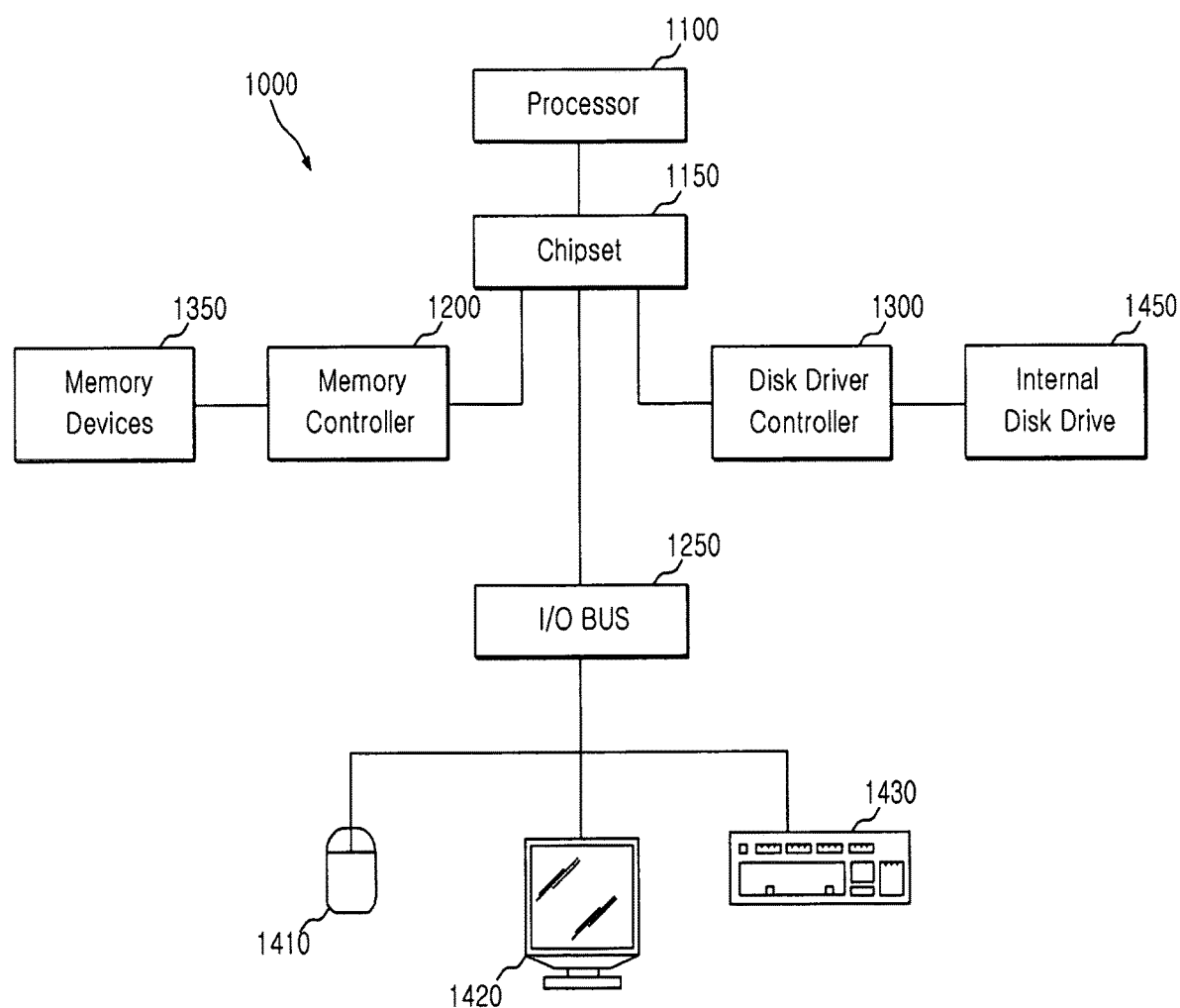

FIG. 2 is a diagram illustrating a first guard unit, a second guard unit, and a dummy pattern part of the semiconductor package according to an embodiment of the invention;

FIG. 3 is a diagram illustrating the structure of the first and second guard parts of the semiconductor package according to an embodiment of the invention;

FIGS. 4A and 4B are diagrams illustrating the structure of the dummy pattern part of the semiconductor package according to an embodiment of the invention;

FIG. 5 is a diagram illustrating the structure of a semiconductor package according to an embodiment of the invention;

FIG. 6 is a diagram illustrating first to fourth guard units and a dummy pattern part of the semiconductor package according to an embodiment of the invention; and FIG. 7 illustrates a block diagram of a system employing a memory controller circuit in accordance with an embodiment of the invention.

DETAILED DESCRIPTION

Hereinafter, a semiconductor package according to the invention will be described below with reference to the accompanying figures through various embodiments. In order to package the plurality of semiconductor chips stacked through TSVs, a molding process must be performed. During the molding process, however, a crack may occur in the semiconductor chips or the reliability of the semiconductor chips may be degraded by moisture. Various embodiments are directed to a semiconductor package which includes two or more guard units so as to improve the reliability thereof.

Figure 1:
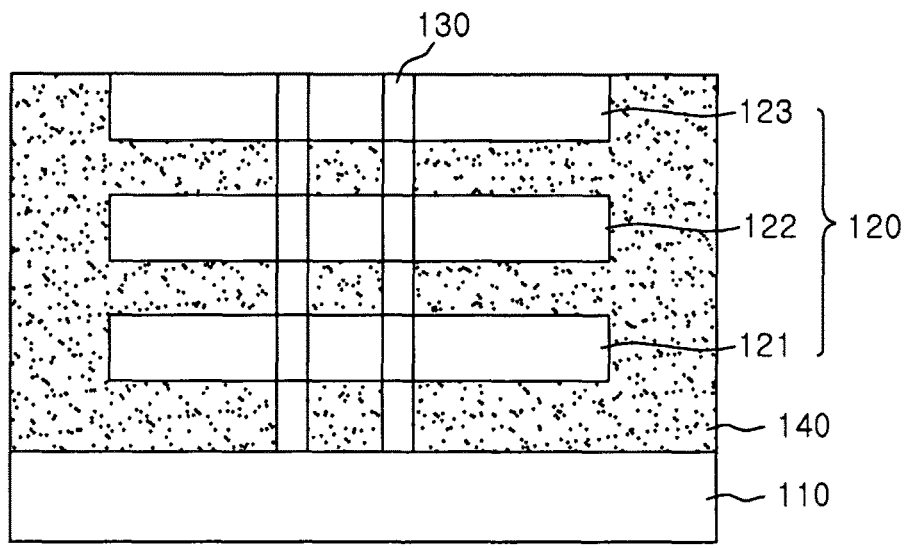
FIG. 1 is a diagram illustrating the structure of a semiconductor package according to an embodiment of the invention.

Referring to FIG. 1, the semiconductor package 100 invention may include a master chip 110, first to third slave chips 121 to 123, a through silicon via (TSV) 130, and a molding part 140. The first to third slave chips 121 and 123 may be configured to be stacked over the master chip 110. The TSV 130 may be formed through the first to third slave chips 121 to 123. The molding part 140 may be configured to cover the top surface of the master chip 110 including the plurality of slave chips 120, to protect the plurality of slave chips 120 from the external environment. The master chip 100 may be configured to have a larger size than the plurality of slave chips 200. This is because the semiconductor package 100 according to an embodiment of the invention includes two or more guard units to prevent a package defect caused by moisture or crack. Further, a second guard unit among the guard units is disposed at the master chip 110.

Referring to FIG. 2, the semiconductor package 100 according to an embodiment may further include a first guard unit 210, a second guard unit 220, and a dummy pattern part 230, in addition to the components illustrated in FIG. 1.

The first guard unit 210 may be configured to be formed at the outermost part of the first to third slave chips 121 to 123 to protect the respective slave chips 120.

The second guard unit 220 may be formed at the outermost part of the master chip 110. More specifically, the second guard unit 220 may be configured to be disposed at a first distance from the first guard unit 210 and formed over the outermost part of the master chip 110. The second guard unit 220 may be configured to be formed to such a height to ensure that the plurality of slave chips 120 are stacked. The first distance may correspond to a difference in size between the master chip 110 and the plurality of slave chips 120. In an embodiment, the second guard unit 220 may be formed at the outermost part of the master chip 110, but the invention is not limited thereto to such a configuration. More specifically, the second guard unit 220 may not be formed at the outermost part of the master chip 110, but formed at a predetermined distance from the first guard unit 210. The predetermined distance may correspond to a difference in size between the master chip 110 and the slave chips 120. However, when the second guard unit 220 is not formed at the outermost part of the master chip 110 but formed so that the distance between the first and second guard unit 210 and 220 is small, additional dummy patterns may be formed to make up for the difference in size between the master chip 110 and the plurality of slave chips 120.

Referring to FIG. 3, the structure of the first guard unit 210 will be described in more detail. The first guard unit 210 may be configured to include an active layer 211, a first metal contact barrier layer 212, a first metal layer 213, a second metal contact barrier layer 214, a second metal layer 215, a third metal contact barrier layer 216, and a third metal layer 217. The first metal contact barrier layer 212 may be configured to be vertically formed over the active layer 211. The first metal layer 213 may be horizontally formed over the first metal contact barrier layer 212. The second metal contact barrier layer 214 may be vertically formed over the first metal layer 213. The second metal layer 215 may be horizontally formed over the second metal contact barrier layer 214. The third metal contact barrier layer 216 may be vertically formed over the second metal layer 215. Further, the third metal layer 217 may be horizontally formed over the second metal contact barrier layer 216. The second guard unit 220 may be configured to have the same structure as the first guard unit 210.

The dummy pattern part 230 may be disposed for each layer so that a level difference is not formed between the first and second guard units 210 and 220. Furthermore, the dummy pattern part 230 may be disposed for each layer at the outermost part to make up for the difference in size between the master chip 110 and the slave chips 120. Referring to FIGS. 4A and 4B, FIG. 4A illustrates the dummy pattern part 230 formed between the first and second guard units 210 and 220. In addition, FIG. 4B illustrates the dummy pattern part 230 formed to make up for a difference in size between the master chip 110 and the slave chips 120 when the first and second guard units 210 and 220 are formed without distance provided there between. First, the structure of the dummy pattern part 230 will be described in FIG. 4A. The dummy pattern part 230 of the semiconductor package 100 according to an embodiment of the invention may include dummy metal patterns 232 formed over insulation layers 231 to insulate the respective slave chips 121 to 123 over the master chip 110. In other words, the dummy pattern part 230 may be formed in the molding part 140 for the slave chips 121 to 134. The dummy metal pattern 232 may be configured to include vertical bar-shaped patterns having a predetermined width. The dummy metal pattern 232 may also include one or more of an isolation region pattern (hereinafter, ISO) and a gate.

Referring to FIG. 4B, the dummy pattern part 230 may include dummy metal patterns 234 formed over insulation layers 233 to insulate the respective slave chips 121 to 123 over the master chip 110. The dummy metal patterns 234 may include box-shaped or bar-shaped patterns. Furthermore, the dummy metal patterns 234 may also include metal lines.

The dummy pattern part 230 formed in such a manner may be used as either a test circuit or fuse circuit.

The structure including two or more guard units may also be applied to a semiconductor package referred to as a system package wherein a plurality of semiconductor chips having different functions are packaged and sealed so as to implement a system.

Referring to FIG. 5, a semiconductor package 500 according to an embodiment of the invention may include an interposer 510, a semiconductor chip 520, a control chip 530, and a molding part 540.

The interposer 510 may be referred to as a semiconductor substrate. The interposer 510 may be configured to include conductive patterns (not illustrated) to electrically couple the semiconductor chip 520 and the control chip 530. The interposer 510 may be electrically coupled to an external circuit through a bump 511. At the outermost part of the interposer 510, a guard unit may be formed to protect the semiconductor package.

The semiconductor chip 520 may be disposed at one side of the top surface of the interposer 510. The semiconductor chip 520 may also serve to store data according to control of the control chip 530. The semiconductor chip 520 may include a master chip 521, first to third slave chips 522a to 522c, and a TSV 523. The first to third slave chips 522a to 522c may be configured to be stacked over the master chip 521. The TSV 522 may be formed through the first to third slave chips 522a to 522c. The master chip 521 may also have a larger size than the plurality of slave chips 522 because one guard unit is formed at the master chip 521 and another guard unit is formed at each of the slave chips 522a to 522c to reduce a package defect caused by moisture or crack. The guard units will be described with reference to FIG. 6.

The control chip 530 may be disposed at the other side of the top surface of the interposer 510. The control chip 350 may also serve to control overall operations of the semiconductor chip 520. The control chip 530 may also be electrically coupled to the interposer 510 through a control chip bump 531. Furthermore, a guard unit to protect the control chip 530 may be formed at the outermost part of the control chip 530. FIG. 5 also includes a control chip bump 524 electrically coupled to the master chip 521.

The molding part 540 may be configured to serve to cover the top surface of the semiconductor package 500 according to an embodiment and protect the semiconductor chip 520 and the control chip 530 from the external environment.

Referring to FIG. 6, the semiconductor package 500 according to an embodiment of the invention may include a first guard unit 512, a second guard unit 525, a third guard unit 526, a fourth guard unit 532, and a dummy pattern part 550. The first guard unit 512 may be configured to be formed at the outermost part of the interposer 510. The second guard unit 525 may be configured to be formed at the outermost part of the master chip 521 of the semiconductor chip 520. The third guard unit 526 may be configured to be formed at each of the slave chips 522 of the semiconductor chip 520. The fourth guard unit 532 may be configured to be formed at the outermost part of the control chip 530. The dummy pattern part 550 may serve to make up for a difference in height or size among the guard units 512, 525, 526, and 532 accordingly.

The third guard unit 526 of the semiconductor chip 520 may be configured to be formed to such a height to allow the slave chips 522 to be stacked. Furthermore, the second and third guard units 525 and 526 of the semiconductor chip 520 may be formed at a first distance from each other. In addition, the first distance may correspond to a difference in size between the master chip 525 and the slave chips 522. In order to make up for such a size difference, a first dummy pattern part 550a may be formed as a result. Furthermore, a second dummy pattern part 550b may also be formed in spaces among the interposer 510, the semiconductor chip 520, and the control chip 530. The first to fourth guard units 512 to 532 may have substantially the same structure as described with reference to FIG. 3. In addition, the dummy pattern part 550 may also have substantially the same structure as described with reference to FIG. 4. Thus, the detailed descriptions thereof are omitted.

The semiconductor packages 100 and 500 according to the embodiments of the invention may include two or more guard units disposed therein. Therefore, since the semiconductor packages 100 and 500 can be protected through a double or triple protection structure, it is possible to reduce defects of the semiconductor package 100, caused by moisture or crack accordingly.

Referring to FIG. 7, a system 1000 may include one or more processors 1100. The processor 1100 may be used individually or in combination with other processors. A chipset 1150 may be electrically coupled to the processor 1100. The chipset 1150 may be a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory device 1350 may include the semiconductor package 100 described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

While certain embodiments have been described above, it will be understood to those skilled in the art that the embodiments described are by way of example only. Accordingly, the semiconductor package described should not be limited based on the described embodiments. Rather, the semiconductor package described should only be limited in light of the claims that follow when taken in conjunction with the above description and accompanying figures.

What is claimed is:

1. A semiconductor package comprising:
   a first chip;
   a plurality of second chips sequentially stacked over the first chip and each of the second chips having a smaller size than the first chip;
   a plurality of first guard units provided to connect between an undermost second chip and the first chip, and between adjacent second chips, each of the first guard units including an extension pad which expands the size of the each of the second chips to the size of the first chip, and a vertical guard ring for contacting an outer edge of a backside of the each of the second chips with an inner edge of the extension pad; and
   a plurality of second guard units positioned between outer edges of the extension pads connected to the backside of the each of the second chips through the vertical guard ring, respectively, and
   a mold part configured to surround the first chip and the plurality of second chips,
   wherein the plurality of first guard units and the plurality of second guard units are configured to protect the first chip and the plurality of second chips.

2. The semiconductor package according to claim 1, wherein the first chip and each of the second chips include through silicon vias (TSVs), and
   a TSV of the first chip and a TSV of each of the second chips having a same function are electrically coupled to each other.

3. The semiconductor package according to claim 1, wherein the first chip is a master chip and each of the second chips is a slave chip.

4. The semiconductor package according to claim 1, wherein the vertical guard ring is configured of a plurality of conductive pads and a plurality of conductive plugs alternatively stacked.

5. The semiconductor package according to claim 1, wherein each of the plurality of second guard units are configured of a plurality of conductive pads and a plurality of conductive plugs alternately stacked.

6. The semiconductor package according to claim 1, wherein a plurality of dummy patterns are interposed between the plurality of first guard units and the plurality of second guard units.

* * * * *